US012578650B2

(12) United States Patent
Ushimaru et al.

(10) Patent No.: US 12,578,650 B2
(45) Date of Patent: Mar. 17, 2026

(54) SUBSTRATE PROCESSING APPARATUS AND SUBSTRATE PROCESSING METHOD

(71) Applicant: Tokyo Electron Limited, Tokyo (JP)

(72) Inventors: Koji Ushimaru, Koshi (JP); Kenji Iizuka, Koshi (JP); Kei Miyazaki, Koshi (JP); Yukinobu Otsuka, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/574,492

(22) PCT Filed: Apr. 26, 2022

(86) PCT No.: PCT/JP2022/018929
§ 371 (c)(1),
(2) Date: Dec. 27, 2023

(87) PCT Pub. No.: WO2023/209815
PCT Pub. Date: Nov. 2, 2023

(65) Prior Publication Data
US 2025/0102918 A1     Mar. 27, 2025

(51) Int. Cl.
*G03F 7/40* (2006.01)
*F27B 17/00* (2006.01)
(Continued)

(52) U.S. Cl.
CPC ............ *G03F 7/40* (2013.01); *F27B 17/0025* (2013.01); *F27D 7/02* (2013.01); *H01L 21/0274* (2013.01)

(58) Field of Classification Search
CPC .......... G03F 7/40; G03F 7/38; F27B 17/0025; F27D 7/02; H01L 21/0274; H01L 21/027;
(Continued)

(56) References Cited

U.S. PATENT DOCUMENTS 7,223,690 B2 * 5/2007 Kondo .............. H01L 21/67184
257/E21.585
8,963,050 B2 * 2/2015 Kato ................. H01L 21/67115
219/385
(Continued)

FOREIGN PATENT DOCUMENTS

JP       2005-064277 A      3/2005
JP       2006-310391 A      11/2006
(Continued)

OTHER PUBLICATIONS

International Search Report for PCT/JP2022/018929 dated Jul. 26, 2022.

*Primary Examiner* — Hung V Nguyen
(74) *Attorney, Agent, or Firm* — Chrisman Gallo Tochtrop LLC

(57) ABSTRACT

A substrate processing apparatus includes a hot plate configured to support a substrate having a film formed thereon and perform a heat treatment of heating the substrate; a chamber configured to cover the substrate supported by the hot plate; a gas discharger, having a head member provided with multiple discharge holes distributed along a surface facing the substrate supported by the hot plate, configured to discharge a gas toward a surface of the substrate from the multiple discharge holes; a peripheral exhaust device configured to evacuate a processing space within the chamber from an outer peripheral region outside a periphery of the substrate supported by the hot plate; and a controller. The controller controls the peripheral exhaust device to increase an exhaust amount from the peripheral exhaust device in a state that the substrate is heated.

18 Claims, 9 Drawing Sheets

(51) Int. Cl.
　　　*F27D 7/02*　　　　　(2006.01)
　　　*H01L 21/027*　　　 (2006.01)

(58) Field of Classification Search
　　　CPC ........... H01L 21/67103; H01L 21/6838; H01L
　　　　　　　　　　　　　　　　　　　　　　　　　21/68785
　　　See application file for complete search history.

(56)　　　　　　　　　References Cited

U.S. PATENT DOCUMENTS

| | | | | |
|---|---|---|---|---|
| 11,437,252 | B2 * | 9/2022 | Namba | ............. H01L 21/32134 |
| 11,798,821 | B2 * | 10/2023 | Otsuka | ............. H01L 21/67109 |
| 2018/0076063 | A1 | 3/2018 | Nakayama et al. | |

FOREIGN PATENT DOCUMENTS

| | | | |
|---|---|---|---|
| JP | 2008-186934 | A | 8/2008 |
| JP | 2018-056182 | A | 4/2018 |
| JP | 2020-129607 | A | 8/2020 |
| JP | 2021-068886 | A | 4/2021 |
| JP | 2022-007534 | A | 1/2022 |

* cited by examiner

SUBSTRATE PROCESSING APPARATUS AND SUBSTRATE PROCESSING METHOD

CROSS-REFERENCE TO RELATED APPLICATIONS

This Application is a U.S. national phase application under 35 U.S.C. § 371 of PCT Application No. PCT/JP2022/018929 filed on Apr. 26, 2022, and the entire disclosure is incorporated herein by reference.

TECHNICAL FIELD

The various aspects and embodiments described herein pertain generally to a substrate processing apparatus and a substrate processing method.

BACKGROUND

Patent Document 1 discloses a substrate processing apparatus including a heating device that performs a heating processing on a coating film formed on a substrate. The heating device described in Patent Document 1 is equipped with a heater disposed in a processing vessel to heat the substrate, a pipeline for supplying a gas into the heating device from an outer peripheral side of the substrate, and an exhaust line for exhausting an atmosphere inside the heating device from above a central portion of the substrate.

Patent Document 1: Japanese Patent Laid-open Publication No. 2018-056182

SUMMARY

In an exemplary embodiment, a substrate processing apparatus includes a hot plate configured to support a substrate having a film formed thereon and perform a heat treatment of heating the substrate; a chamber configured to cover the substrate supported by the hot plate; a gas discharger, having a head member provided with multiple discharge holes distributed along a surface facing the substrate supported by the hot plate, configured to discharge a gas toward a surface of the substrate from the multiple discharge holes; a peripheral exhaust device configured to evacuate a processing space within the chamber from an outer peripheral region outside a periphery of the substrate supported by the hot plate; and a controller. The controller controls the peripheral exhaust device to increase an exhaust amount from the peripheral exhaust device in a state that the substrate is heated.

BRIEF DESCRIPTION OF THE DRAWINGS

FIG. 3 is a schematic diagram illustrating a heat treatment device.

Figure 5:
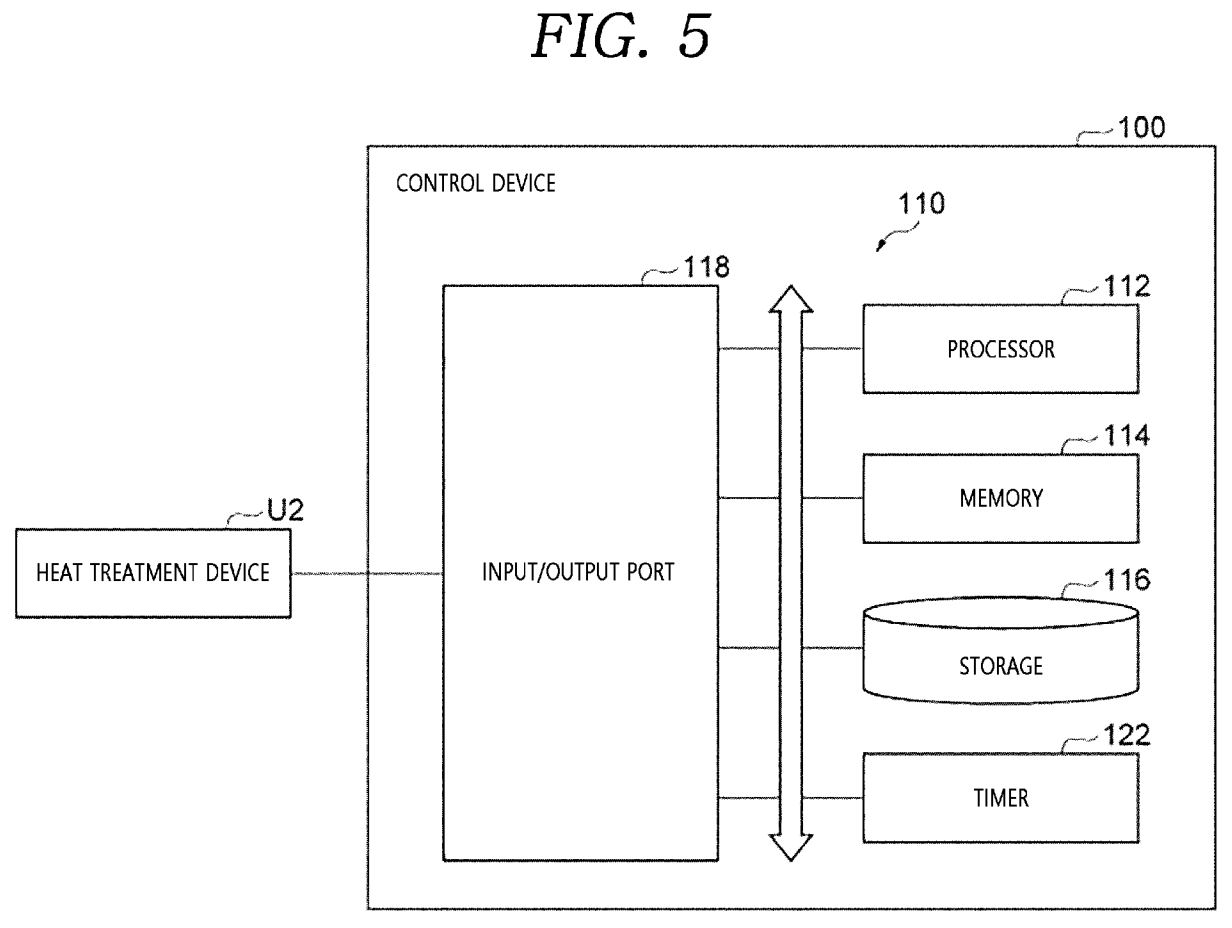

FIG. 5 is a block diagram illustrating an example of a hardware configuration of a control device.

DETAILED DESCRIPTION

Exemplary Embodiment

Figure 1:
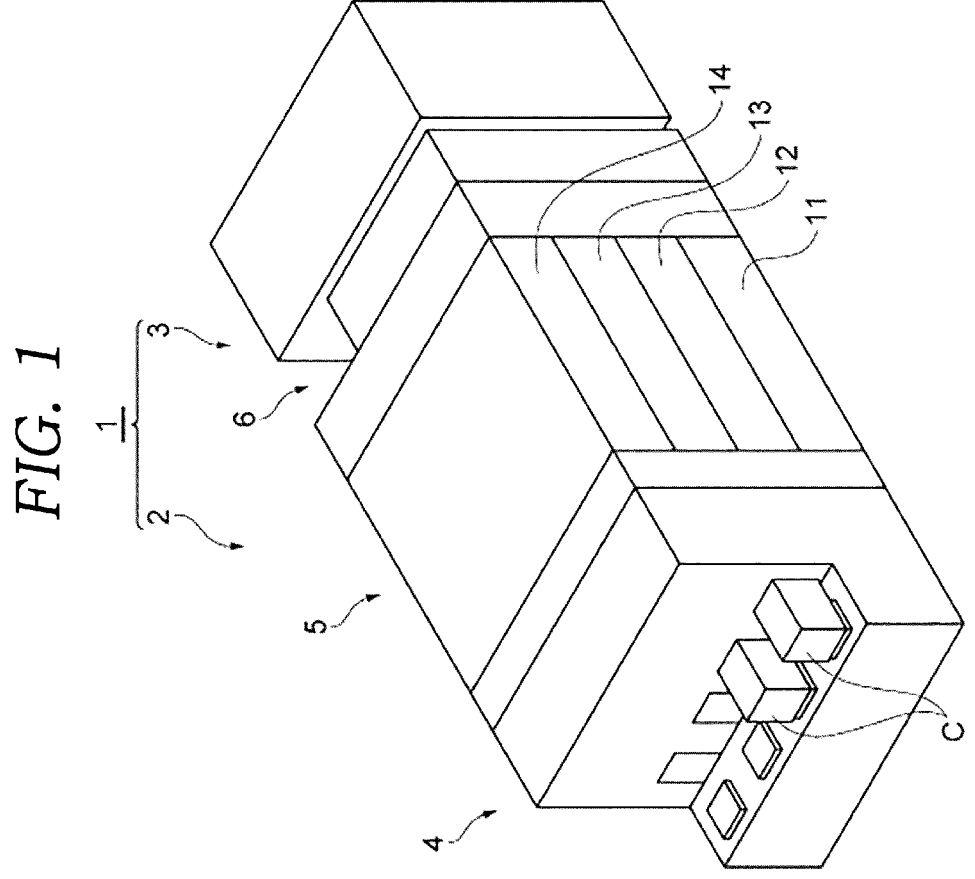
FIG. 1 is a schematic diagram illustrating an example of a substrate processing system.

Hereinafter, an exemplary embodiment of the present disclosure will be described with reference to the accompanying drawings. In the following description, same parts or parts having same function will be assigned same reference numerals, and redundant description will be omitted.

Referring to FIG. 1 to FIG. 5, a substrate processing system according to the exemplary embodiment will be explained. A substrate processing system 1 shown in FIG. 1 is configured to perform, on a substrate, formation of a photosensitive film, exposure of the photosensitive film, and development of the photosensitive film. The substrate as a processing target is, for example, a workpiece W of a semiconductor. The photosensitive film is, for example, a resist film. The substrate processing system 1 is equipped with a coating and developing apparatus 2 and an exposure apparatus 3. The exposure apparatus 3 is configured to expose the resist film (photosensitive film) formed on the workpiece W (substrate). Specifically, the exposure apparatus 3 radiates an energy ray to an exposure target portion of the resist film by a liquid immersion exposure method or the like. Before this exposure processing by the exposure apparatus 3, the coating and developing apparatus 2 performs a processing of coating a surface of the workpiece W having a bottom film thereon with a resist (chemical liquid) to form the resist film, and after the exposure processing, the coating and developing apparatus 2 performs a developing processing for the resist film.

[Substrate Processing Apparatus]

Figure 2:
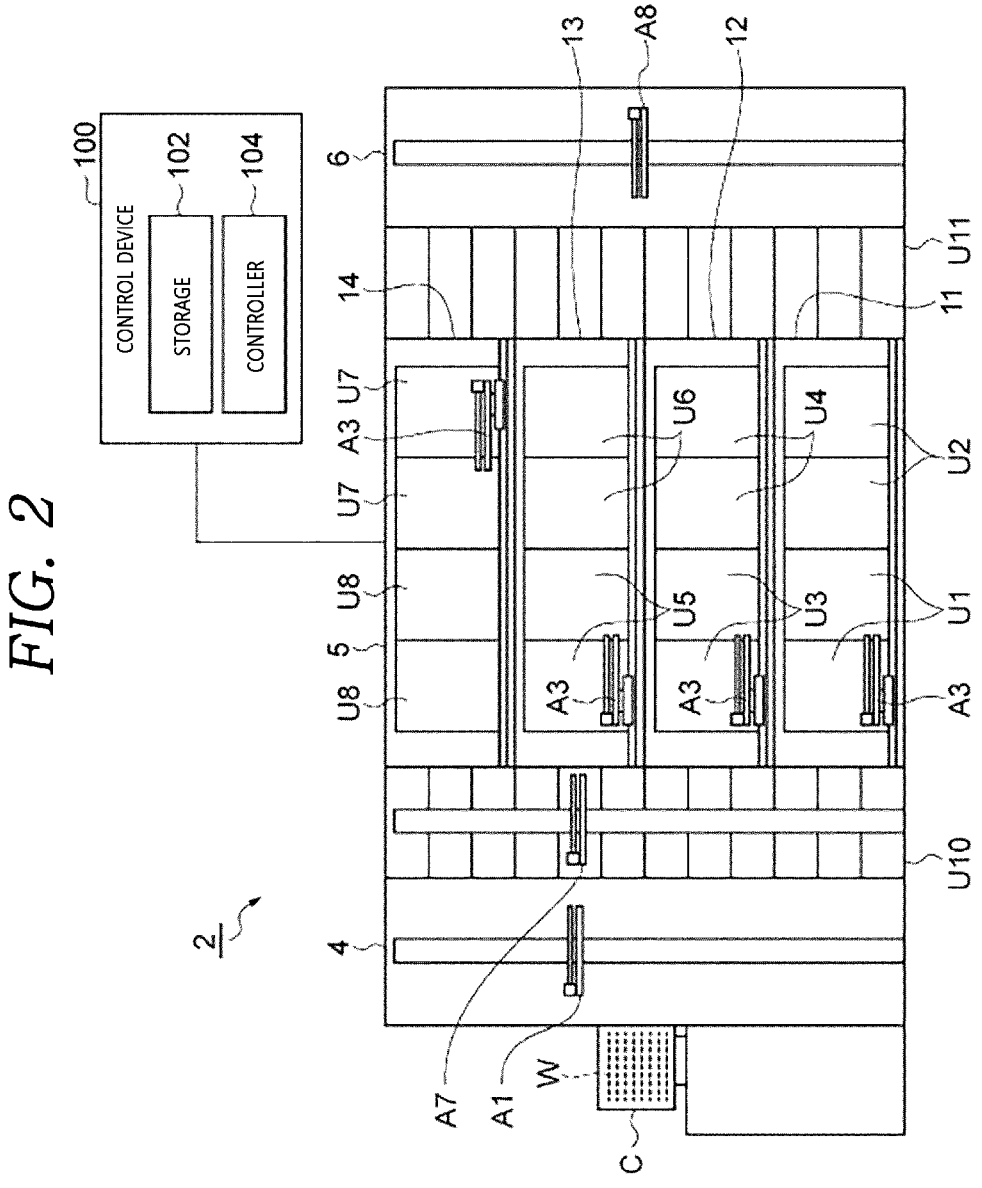
FIG. 2 is a schematic diagram illustrating an example of a coating and developing apparatus.

Hereinafter, a configuration of the coating and developing apparatus 2 as an example of a substrate processing apparatus will be explained. As shown in FIG. 1 and FIG. 2, the coating and developing apparatus 2 is equipped with a carrier block 4, a processing block 5, an interface block 6, and a control device 100 (controller).

The carrier block 4 is configured to perform a carry-in of the workpiece W into the coating and developing apparatus 2 and a carry-out of the workpiece W from the coating and developing apparatus 2. For example, the carrier block 4 is configured to support a plurality of carriers C for workpieces W, and incorporates therein a transfer device A1 including a delivery arm. The carrier C accommodates therein a multiple number of workpieces W having a circular shape, for example. The transfer device A1 takes out the workpiece W from the carrier C, hands the workpiece W over to the processing block 5, receives the workpiece W from the processing block 5, and returns the workpiece W back into the carrier C. The processing block 5 has a plurality of processing modules 11, 12, 13 and 14.

The processing module 11 incorporates therein coating devices U1, heat treatment devices U2, and a transfer device A3 configured to transfer the workpiece W to these devices. The processing module 11 is configured to form a bottom film on a surface of the workpiece W by the coating device U1 and the heat treatment device U2. The coating device U1 is configured to coat a processing liquid for forming the bottom film on the workpiece W. The heat treatment device U2 is configured to perform various kinds of heat treatments required to form the bottom film. That is, the heat treatment device U2 performs a heat treatment on the workpiece W on which a film of the processing liquid is formed. As a result, the bottom film is formed on the surface of the workpiece W. A specific example of the bottom film may be a so-called hard mask such as a spin-on carbon (SOC) film. When the workpiece W having the film formed thereon is heated in the heat treatment, a sublimate (unnecessary substance) is generated from the film. For this reason, the heat treatment device U2 is provided with an exhaust device configured to exhaust the sublimate.

The processing module 12 incorporates therein coating devices U3, heat treatment devices U4, and a transfer device A3 configured to transfer the workpiece W to these devices. The processing module 12 is configured to form the resist film on the bottom film by the coating device U3 and the heat treatment device U4. The coating device U3 is configured to coat a processing liquid for forming the resist film on the bottom film. The heat treatment device U4 performs various kinds of heat treatments required to form the resist film.

The processing module 13 incorporates therein coating devices U5, heat treatment devices U6, and a transfer device A3 configured to transfer the workpiece W to these devices. The processing module 13 is configured to form a top film on the resist film by the coating device U5 and the heat treatment device U6. The coating device U5 is configured to coat a liquid for forming the top film on the resist film. The heat treatment device U6 is configured to perform various kinds of heat treatments required to form the top film.

The processing module 14 incorporates therein developing devices U7, heat treatment devices U8, and a transfer device A3 configured to transfer the workpiece W to these devices. The processing module 14 is configured to perform the developing processing for the resist film after being subjected to the exposure processing by the developing device U7, and a heat treatment required to perform the developing processing by the heat treatment device U8. The developing device U7 is configured to perform the development of the resist film by coating a developing liquid on the surface of the workpiece W after being subjected to the exposure processing and washing this developing liquid away with a rinse liquid. The heat treatment device U8 is configured to perform various kinds of heat treatments required for the developing processing. Specific examples of these heat treatments may include a heat treatment before development (PEB: Post Exposure Bake), a heat treatment after development (PB: Post Bake), and the like.

Within the processing block 5, a shelf device U10 is provided near the carrier block 4. The shelf device U10 is partitioned into a multiple number of cells arranged in a vertical direction. A transfer device A7 including an elevating arm is provided near the shelf device U10. The transfer device A7 is configured to move the workpiece W up and down between the cells of the shelf device U10.

Within the processing block 5, a shelf device U11 is provided near the interface block 6. The shelf device U11 is partitioned into a multiple number of cells arranged in the vertical direction.

The interface block 6 is configured to deliver the workpiece W to/from the exposure apparatus 3. For example, the interface block 6 incorporates therein a transfer device A8 including a delivery arm, and is connected to the exposure apparatus 3. The transfer device A8 hands the workpiece W placed on the shelf device U11 over to the exposure apparatus 3. The transfer device A8 receives the workpiece W from the exposure apparatus 3 and returns it back into the shelf device U11.

Further, the specific configuration of the substrate processing apparatus is not merely limited to the configuration of the coating and developing apparatus 2 described above. The substrate processing apparatus may have any of various configurations as long as it has a heat treatment device configured to perform a heat treatment of a film such as the bottom film and a control device capable of controlling it. (Heat Treatment Device)

Figure 3:
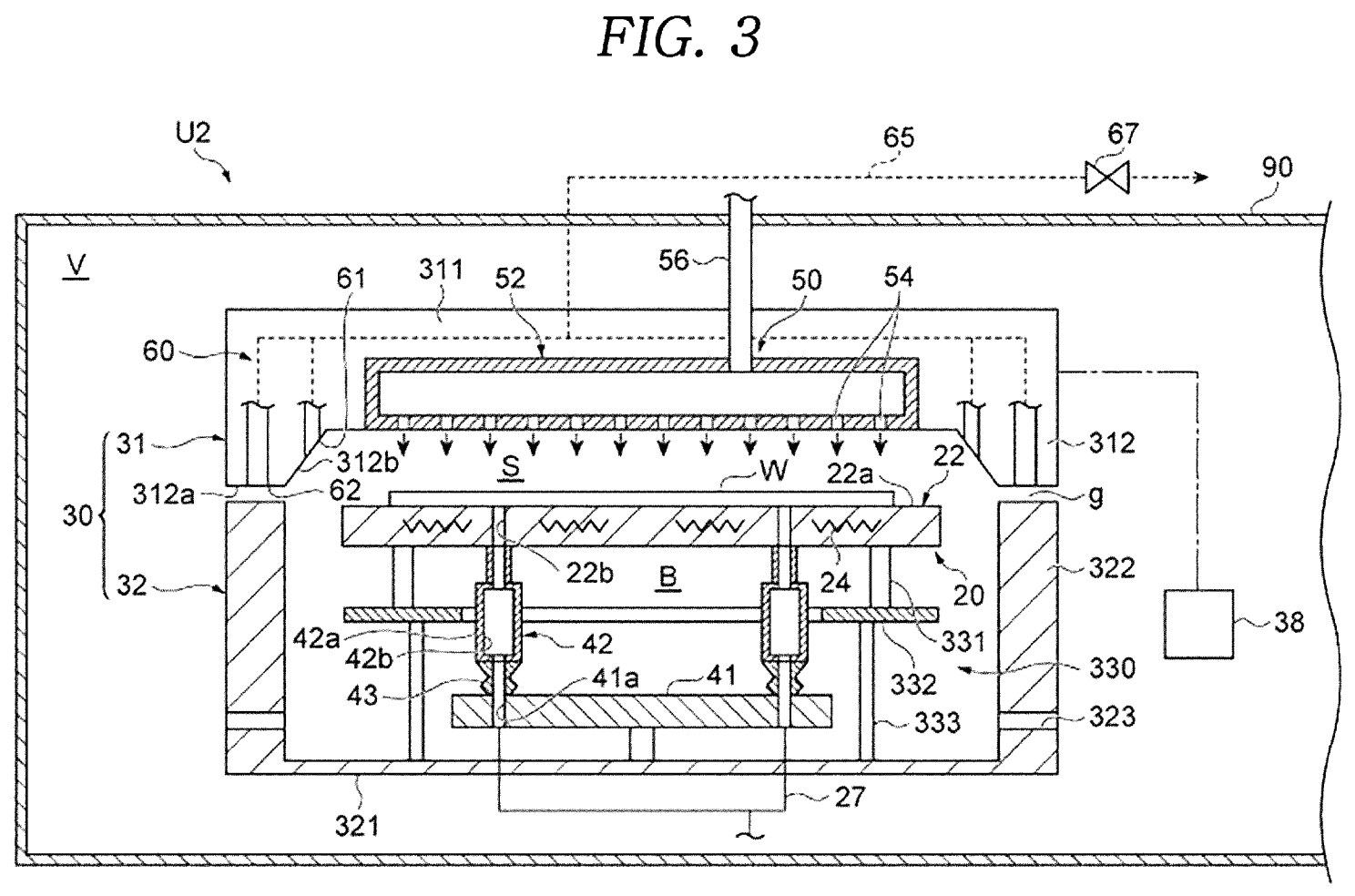

Now, referring to FIG. 3 and FIG. 4, an example of the heat treatment device U2 of the processing module 11 will be described in detail. As shown in FIG. 3, the heat treatment device U2 includes a housing 90, a heating device 20, a chamber 30, and a peripheral exhaust device 60. The housing 90 accommodates therein at least the heating device 20 and the chamber 30. In this case, the chamber 30 is disposed in an accommodation space V formed by the housing 90. In FIG. 3, hatching indicating a cross section is omitted except for some elements.

The chamber 30 includes an upper chamber 31 and a lower chamber 32. The upper chamber 31 is located on the upper side, and the lower chamber 32 is located on the lower side. Further, the lower chamber 32 accommodates the heating device 20 therein.

The heating device 20 supports the workpiece W thereon and heats it. The heating device 20 includes, for example, a hot plate 22 and a hot plate heater 24. The hot plate 22 supports the workpiece W as a heat treatment target thereon, and transfers heat to the workpiece W supported thereon. The hot plate heater 24 is configured to raise the temperature of the hot plate 22. As an example, the temperature of the hot plate 22 is maintained at about 300° to 500° during the heat treatment. The hot plate heater 24 is provided within the hot plate 22, for example. As an example, the hot plate 22 is formed to have a substantially disk shape. The diameter of the hot plate 22 may be larger than the diameter of the workpiece W. The hot plate 22 has a placement surface 22a, and supports the workpiece W with the workpiece W placed at a predetermined position on the placement surface 22a. The hot plate 22 may be made of a metal having high thermal conductivity, such as aluminum, silver, or copper. A space above the placement surface 22a of the hot plate 22 serves as a processing space S in which the heat treatment for the workpiece W is performed.

The hot plate 22 has, for example, a plurality of attraction holes 22b configured to attract the workpiece W. Each attraction hole 22b is formed to penetrate the hot plate 22 in a thickness direction thereof.

In addition, each attraction hole 22b is connected to a relay hole 41a of a relay member 41. Each relay hole 41a is connected to an exhaust line 27 through which evacuation for attraction is performed.

The attraction hole 22b and the relay hole 41a are connected via a metal member 42 made of metal and a resin pad 43 made of a resin. Specifically, the attraction hole 22b and the relay hole 41a are connected through a flow path in the metal member 42 and a flow path in the resin pad 43.

The metal member 42 is located on the attraction hole 22b side, and the resin pad 43 is located on the relay hole 41a side. One end of the metal member 42 is directly connected to the hot plate 22 (specifically, the attraction hole 22b), and the other end thereof is directly connected to one end of the corresponding resin pad 43. In other words, each resin pad 43 is allowed to communicate with the corresponding attraction hole 22b and connected to the hot plate 22 through the corresponding metal member 42. Additionally, the other end of the resin pad 43 is directly connected to the relay member 41 (specifically, the relay hole 41*a*).

The metal member 42 has a large-diameter portion 42*a* on the resin pad 43 side. The large-diameter portion 42*a* has therein a flow path space 42*b* whose cross-sectional area is larger than that of a portion (upper end) of the metal member 42 connected to the hot plate 22. This configuration reduces the risk of clogging due to the sublimate generated in the heat treatment. Further, owing to the presence of this flow path space 42*b* having the large cross-sectional area, a gas sucked from the processing space S during the attraction of the workpiece W is allowed to flow toward the exhaust line 27 for attraction with its heat reduced. That is, the risk of deterioration of the resin pad 43 and devices constituting an exhaust path leading to the exhaust line 27 due to a high temperature can be suppressed.

Further, for example, three elevating pins (not shown) configured to support the workpiece W from below and move it up and down are provided below the hot plate 22 within the lower chamber 32. The elevating pins are raised and lowered by an elevating mechanism (not shown) having a driving source such as a motor. This elevating mechanism is controlled by the control device 100. Furthermore, through holes (not shown) for allowing the elevating pins to pass therethrough are formed in a central portion of the hot plate 22. The elevating pins can be protruded from a top surface of the hot plate through the through holes.

The lower chamber 32 that accommodates the heating device 20 therein maintains the hot plate 22 of the heating device 20 at a predetermined position. The lower chamber 32 includes, for example, a support bottom wall 321 and a peripheral wall 322. The support bottom wall 321 is formed in a circular plate shape having a diameter approximately equal to the diameter of the hot plate 22. The peripheral wall 322 is formed to extend upwards from an outer edge of the support bottom wall 321. The peripheral wall 322 is formed in an annular shape and extends up to a height position on a level with the placement surface 22*a* of the hot plate 22. The peripheral wall 322 surrounds the hot plate 22. For example, an inner peripheral surface of the peripheral wall 322 and an outer peripheral surface of the hot plate 22 face each other. A gap may be provided between the inner peripheral surface of the peripheral wall 322 and the outer peripheral surface of the hot plate 22.

The hot plate 22 of the heating device 20 is supported on the support bottom wall 321 of the lower chamber 32, for example. Specifically, the hot plate 22 is supported on the support bottom wall 321 of the lower chamber 32 with a support 330 therebetween. The support 330 includes, by way of example, a supporting column 331 whose upper end is connected to the hot plate 22, an annular member 332 that supports the supporting column 331, and a leg member 333 configured to support the annular member 332 on the bottom wall of the lower chamber 32.

The annular member 332 is made of a metal, and a gap equal to the height of the supporting column 331 is provided between the annular member 332 and most of a rear surface of the hot plate 22. By disposing the resin pad 43 below this annular member 332, the annular member 332 effectively blocks the heat from the hot plate 22, making it difficult for the resin pad 43 to be exposed to a high temperature (to be thermally deteriorated).

Further, an intake port 323 is provided in the peripheral wall 322 of the lower chamber 32. The intake port 323 functions as a gas supply that draws a gas into the chamber 30 from the outside of the chamber 30.

The upper chamber 31 is formed in, for example, a circular plate shape. The upper chamber 31 is disposed with a gap g from the lower chamber 32 so as to cover the workpiece W on the heating device 20 from above when the processing space S is formed. The upper chamber 31 includes, for example, a ceiling plate 311 and a sidewall 312.

The upper chamber 31 includes a gas discharger 50. The gas discharger 50 is configured to discharge a gas toward the workpiece W on the hot plate 22 from above in the processing space S within the chamber 30. The gas discharger 50 discharges the gas toward the substantially entire surface of the workpiece W, for example. Although the kind of the gas discharged by the gas discharger 50 is not particularly limited, air, a gas with an adjusted moisture content, or an inert gas (nitrogen gas) may be used, for example. A gas source is connected to the gas discharger 50 through a supply path 56. The gas discharger 50 may have a head member 52 provided in a ceiling plate 311. The head member 52 is provided with a gas distribution space provided under the ceiling plate 311; and a plurality of discharge holes 54 formed through a lower surface thereof facing the workpiece W on the hot plate 22 to allow the gas distribution space and the processing space S to communicate with each other. The gas distribution space is a space through which the plurality of discharge holes 54 are connected to the supply path 56.

Figure 4:
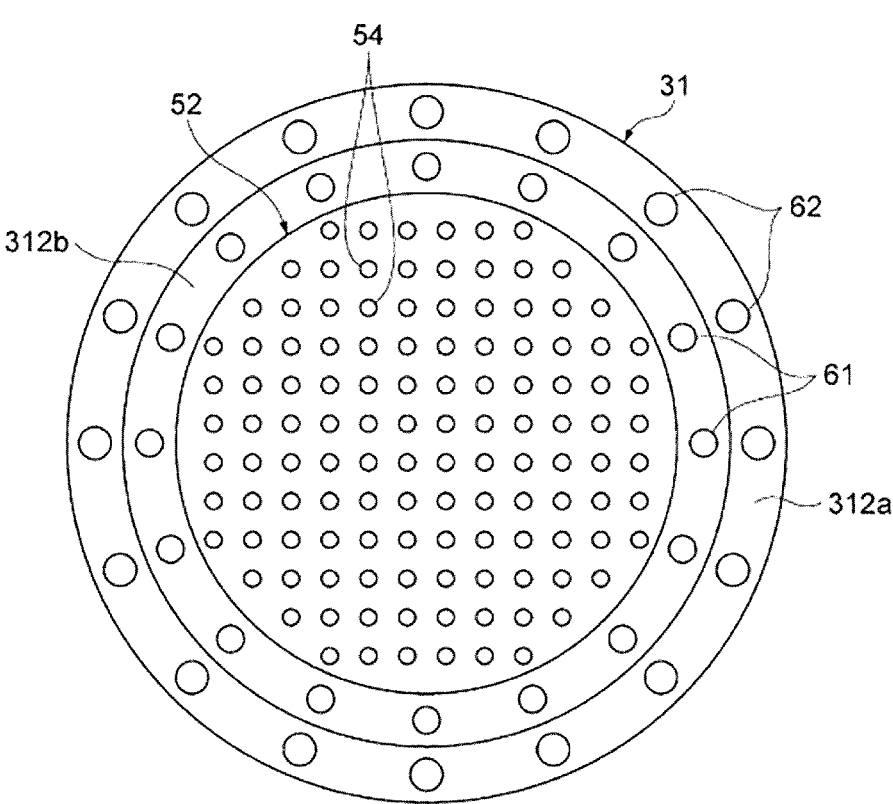
FIG. 4 is a schematic diagram illustrating an example of a gas discharger.

FIG. 4 is a schematic diagram illustrating the upper chamber 31 of FIG. 3 seen from below. As shown in FIG. 4, the plurality of discharge holes 54 are distributed along a bottom surface of the ceiling plate 311. For example, the plurality of discharge holes 54 are distributed in substantially uniform density on a portion (facing portion) of the bottom surface of the ceiling plate 311 facing the workpiece W on the hot plate 22. Additionally, when viewed from above, the discharge holes 54 may also be provided outside the facing portion (outside a periphery of the workpiece W). The plurality of discharge holes 54 are distributed in the facing portion. The plurality of discharge holes 54 may be distributed such that a discharge amount per unit time becomes approximately uniform over the entire surface of the workpiece W when a gas such as air is discharged from the gas discharger 50.

The plurality of discharge holes 54 may have the substantially same opening area. In the case that the opening areas of the plurality of discharge holes 54 are substantially same, the plurality of discharge holes 54 may be distributed such that a ratio of the opening areas of the discharge holes 54 per unit area of the facing portion is uniform. When viewed from a vertical direction, the discharge hole 54 may be of a circular or oval shape. The plurality of discharge holes 54 may be distributed such that distances between the neighboring discharge holes 54 are approximately equal. As an example, when the plurality of discharge holes 54 are two-dimensionally arranged along a transversal direction and a longitudinal direction as shown in FIG. 4, the distance between the neighboring discharge holes 54 in the transversal direction may be uniform, or the distance between the neighboring discharge holes 54 in the longitudinal direction may be uniform. The distance between the neighboring discharge holes 54 in the transversal direction may be approximately the same as the distance between the neighboring discharge holes 54 in the longitudinal direction.

The sidewall 312 is formed to extend downwards from an outer edge of the ceiling plate 311. The sidewall 312 is formed in an annular shape to surround the placement surface 22*a*. FIG. 3 shows an example layout of the upper chamber 31 when the processing space S is formed, and in this layout, a lower end surface 312a of the sidewall 312 faces an upper end surface of the peripheral wall 322 of the lower chamber 32 while being disposed close thereto. Specifically, the gap g is formed between the lower end surface 312a of the sidewall 312 and the upper end surface of the peripheral wall 322, and this gap g allows the processing space S to communicate with a space outside the chamber 30.

An inner peripheral surface 312b of the sidewall 312 may be inclined in the vertical direction such that a distance from a center of the ceiling plate 311 in a horizontal direction decreases as it goes toward the ceiling plate 311 from a lower end of the sidewall 312. In this case, the inner diameter of the sidewall 312 decreases as it goes toward the ceiling plate 311 from the lower end of the sidewall 312.

The upper chamber 31 also includes a peripheral exhaust device 60. The peripheral exhaust device 60 is configured to exhaust the gas in the processing space S from an outer peripheral region outside a periphery of the workpiece W supported by the heating device 20. The peripheral exhaust device 60 has a plurality of first exhaust holes 61 and a plurality of second exhaust holes 62 provided outside the head member 52 of the gas discharger 50.

The plurality of first exhaust holes 61 are provided in the sidewall 312 of the upper chamber 31, and each of the first exhaust holes 61 is opened to the inclined inner peripheral surface 312b of the sidewall 312. As shown in FIG. 4, the plurality of first exhaust holes 61 may be arranged in an annular shape outside the ceiling plate 311. Alternatively, the plurality of first exhaust holes 61 may be provided in the ceiling plate 311, and each of the first exhaust holes 61 may be opened to an outer peripheral portion of the bottom surface of the ceiling plate 311.

The plurality of second exhaust holes 62 are provided in the sidewall 312 of the upper chamber 31, and each of the second exhaust holes 62 is opened to the lower end surface 312a of the sidewall 312. When the chamber 30 is in a closed state, the plurality of second exhaust holes 62 are opened to the gap g between the upper chamber 31 (sidewall 312) and the lower chamber 32 (peripheral wall 322). The plurality of second exhaust holes 62 may be arranged in an annular shape outside the plurality of first exhaust holes 61. The height position of the second exhaust hole 62 is lower than the height position of the first exhaust hole 61.

The first exhaust holes 61 and the second exhaust holes 62 are connected to an exhaust pump via an exhaust duct 65. The exhaust duct 65 may be formed such that exhaust paths respectively connected to the plurality of first exhaust holes 61 and the plurality of second exhaust holes 62 are merged into one path within the upper chamber 31. Further, the exhaust duct 65 may be equipped with a valve 67 configured to control the state of the evacuation. An exhaust amount from the first exhaust holes 61 and the second exhaust holes 62 may be controlled by controlling the opening/closing of the valve 67 by the control device 100. The valve 67 is, by way of non-limiting example, a solenoid valve.

The peripheral exhaust device 60 having the above-described configuration exhausts the gas in the processing space S through the gap g and the second exhaust holes 62 opened to the gap g, and also exhausts the gas in the processing space S through the first exhaust holes 61. In addition, the peripheral exhaust device 60 does not need to have the plurality of first exhaust holes 61, and may discharge the gas in the processing space S through the second exhaust holes 62 and the gap g.

A chamber driver 38 is configured to move the upper chamber 31 in the vertical direction. The upper chamber 31 is lowered by the chamber driver 38 until the sidewall 312 of the upper chamber 31 approaches the peripheral wall 322, so that the processing space S is formed by the chamber 30 (that is, the chamber 30 is closed). As the upper chamber 31 is raised by the chamber driver 38 such that the sidewall 312 of the upper chamber 31 is distanced apart from the peripheral wall 322, the space above the hot plate 22 is opened to the space outside the chamber 30 (that is, the chamber 30 is opened).

Within the chamber 30, along with the gas supplied from the head member 52 of the gas discharger 50 toward the processing space S, an external gas is also introduced through the intake port 323 provided in the lower chamber 32. The gas introduced from the intake port 323 may rise up in a space outside the hot plate 22 and move to the processing space S.

Further, the processing space S is defined as a space within the chamber 30 above the hot plate 22 and inside the sidewall 312. Meanwhile, a space below the hot plate 22 is defined as a buffer space B. The buffer space B is defined as a space below the hot plate 22 and above the annular member 332. In addition, the buffer space B is connected to a flow path of the gas introduced into the processing space S. Here, the buffer space B has a larger volume than the processing space S.

The heat treatment device U2 may further include a cooling plate having a function of cooling the workpiece W. At this time, the cooling plate may be moved back and forth between a cooling position outside the chamber 30 and a carry-in/carry-out position for workpiece W at which at least a part of the cooling plate is placed in the chamber 30. Alternatively, the cooling plate may be fixed to a position parallel to the hot plate 22 in the horizontal direction, and the heat treatment device U2 may be equipped with a transfer arm configured to transfer the workpiece W while being moved between the cooling plate and the hot plate 22.

(Control Device)

The control device 100 controls the individual components of the coating and developing apparatus 2 including the heat treatment device U2. The control device 100 is configured to allow the workpiece W covered by the chamber 30 to be supported on and heated by the heating device 20, allow the gas to be discharged toward the surface of the workpiece W supported by the heating device 20 from the plurality of discharge holes 54, allow the processing space S to be evacuated from the outer peripheral region outside the periphery of the workpiece W, and control the discharge amount and the exhaust amount.

As depicted in FIG. 2, the control device 100 includes a storage 102 and a controller 104 as functional components. The storage 102 stores therein a program for operating the individual components of the coating and developing apparatus 2 including the heat treatment device U2. The storage 102 also stores therein various data (for example, information related to an instruction signal for operating the heat treatment device U2) and information from sensors provided in the individual components. The storage 102 is, by way of non-limiting example, a semiconductor memory, an optical recording disk, a magnetic recording disk, or a magneto-optical recording disk. The program may also be included in an external storage device separate from the storage 102 or in an intangible medium such as a radio signal. The program may be installed into the storage 102 from these other media to be stored in the storage 102. The controller 104 controls the operation of each component of the coating and developing apparatus 2 based on the program read from the storage 102.

The control device 100 is composed of one or more control computers. For example, the control device 100 has a circuit 110 shown in FIG. 5. The circuit 110 has one or more processors 112, a memory 114, a storage 116, a timer 122, and an input/output port 118. The storage 116 has a computer-readable recording medium such as a hard disk. The recording medium stores thereon a program for causing the control device 100 to execute a substrate processing sequence including a heat treatment sequence to be described later. The recording medium may be a removable medium such as a non-volatile semiconductor memory, a magnetic disk, or an optical disk. The memory 114 temporarily stores the program loaded from the recording medium of the storage 116 and an operation result by the processor 112. The processor 112 cooperates with the memory 114 to execute the program, thereby embodying each of the above-described functional modules. The timer 122 measures elapsed time by counting, for example, a reference pulse of a certain period. The input/output port 118 performs input/output of electrical signals to/from the heat treatment device U2 in response to an instruction from the processor 112.

Additionally, the hardware configuration of the control device 100 is not necessarily limited to embodying each functional module by the program. For example, each of the functional modules of the control device 100 may be implemented by a dedicated logic circuit or an ASIC (Application Specific Integrated Circuit) integrating the logic circuit.
[Substrate Processing Sequence]

Figure 6:
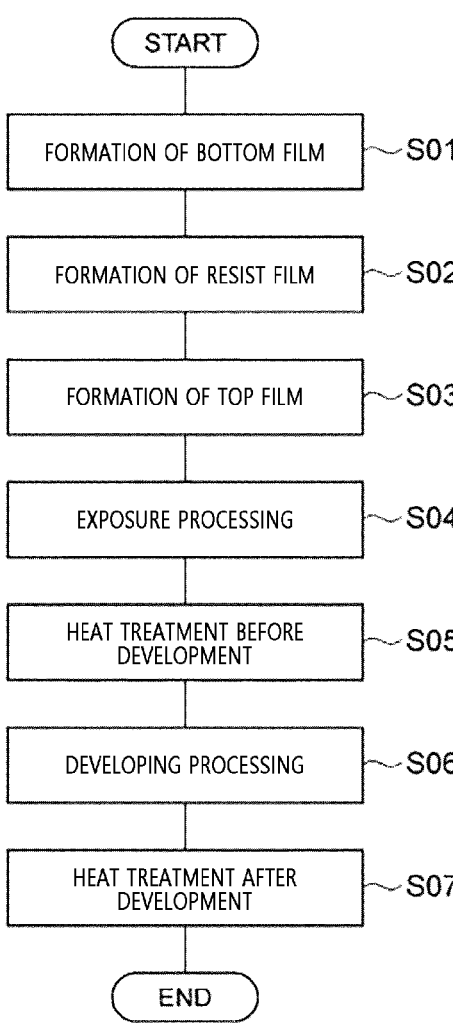
FIG. 6 is a flowchart illustrating an example of a substrate processing sequence.

FIG. 6 is a flowchart showing an example of the substrate processing sequence including a coating and development processing. The control device 100 controls the coating and developing apparatus 2 to perform the coating and development processing on a single sheet of workpiece W in the following sequence, for example. First, the controller 104 of the control device 100 controls the transfer device A1 to transfer the workpiece W in the carrier C to the shelf device U10, and controls the transfer device A7 to place the workpiece W in the cell for the processing module 11.

Next, the controller 104 controls the transfer device A3 to transfer the workpiece W of the shelf device U10 to the coating device U1 and the heat treatment device U2 in the processing module 11. Further, the controller 104 controls the coating device U1 and the heat treatment device U2 to form the bottom film on the surface of the workpiece W (process S01). The heat treatment (hereinafter referred to as a "heat treatment sequence") performed in the process S01 to form the bottom film will be described later. Thereafter, the controller 104 controls the transfer device A3 to return the workpiece W having the bottom film formed thereon back into the shelf device U10, and controls the transfer device A7 to place the workpiece W in the cell for the processing module 12.

Next, the controller 104 controls the transfer device A3 to transfer the workpiece W of the shelf device U10 to the coating device U3 and the heat treatment device U4 within the processing module 12. Further, the controller 104 controls the coating device U3 and the heat treatment device U4 to form the resist film on the bottom film of the workpiece W (process S02). Thereafter, the controller 104 controls the transfer device A3 to return the workpiece W to the shelf device U10, and controls the transfer device A7 to place the workpiece W in the cell for the processing module 13.

Next, the controller 104 controls the transfer device A3 to transfer the workpiece W of the shelf device U10 to each device in the processing module 13. Further, the controller 104 controls the coating device U5 and the heat treatment device U6 to form the top film on the resist film of the workpiece W (process S03). Thereafter, the control device 100 controls the transfer device A3 to transfer the workpiece W to the shelf device U11.

Next, the controller 104 controls the transfer device A8 to send the workpiece W accommodated in the shelf device U11 to the exposure apparatus 3. Then, in the exposure apparatus 3, the exposure processing is performed on the film formed on the workpiece W (process S04). Thereafter, the controller 104 controls the transfer device A8 to receive the workpiece W after being subjected to the exposure processing from the exposure apparatus 3, and place the workpiece W in the cell for the processing module 14 in the shelf device U11.

Subsequently, the controller 104 controls the transfer device A3 to transfer the workpiece W of the shelf device U11 to the heat treatment device U8 within the processing module 14. Then, the control device 100 controls the heat treatment device U8 to perform a heat treatment before development on the film of the workpiece W (process S05). Next, the controller 104 controls the developing device U7 to perform the developing processing on the film of the workpiece W after being subjected to the heat treatment by the heat treatment device U8 (process S06), and controls the heat treatment device U8 to perform a heat treatment after development on the film of the workpiece W after being subjected to the developing processing (process S07). Afterwards, the controller 104 controls the transfer device A3 to return the workpiece W back into the shelf device U10, and controls the transfer device A7 and the transfer device A1 to return the workpiece W back into the carrier C. Through these processes, the substrate processing including the coating and developing processing is completed. The controller 104 may repeat the processing of the processes S01 to S07 for another workpiece W (subsequent workpiece W).
(Heat Treatment Sequence)

Figure 7:
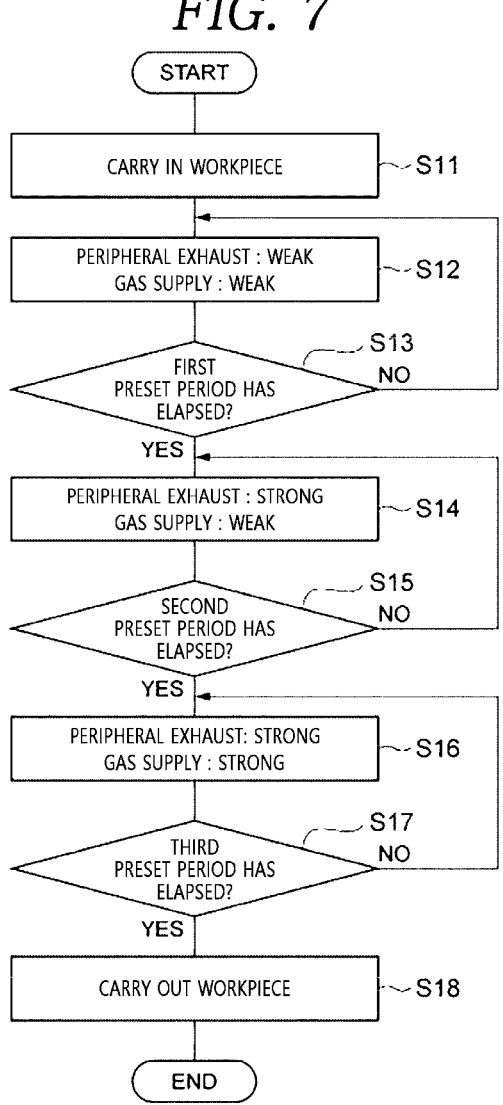
FIG. 7 is a flowchart illustrating an example of a heat treatment sequence.

FIG. 7 is a flowchart showing an example of the heat treatment sequence performed in the heat treatment device U2. The example flowchart in FIG. 7 shows a processing sequence when heat treatments are sequentially performed on the single sheet of workpiece W in the heat treatment device U2. Further, it is assumed that the hot plate 22 is maintained at a predetermined temperature.

Figure 8A:
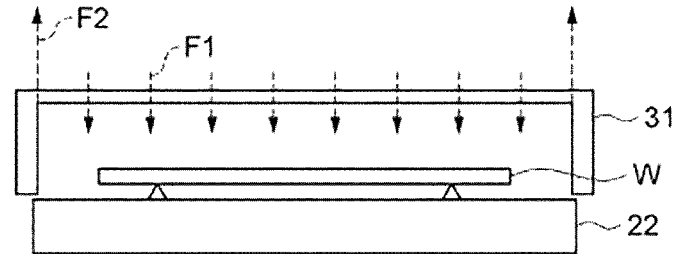
FIG. 8A to FIG. 8C are diagrams illustrating an example of operations of individual components and a flow of a gas in the heat treatment sequence.
Figure 8B:
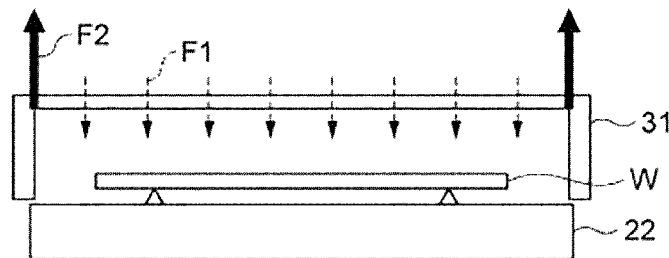
Figure 8C:
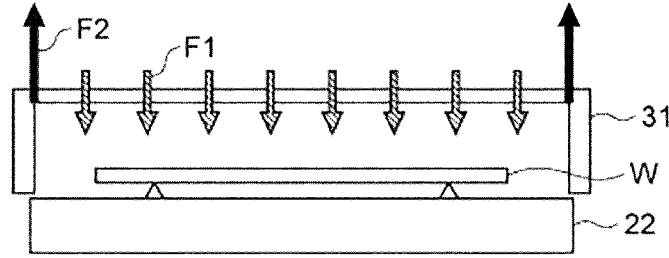
Figure 9:
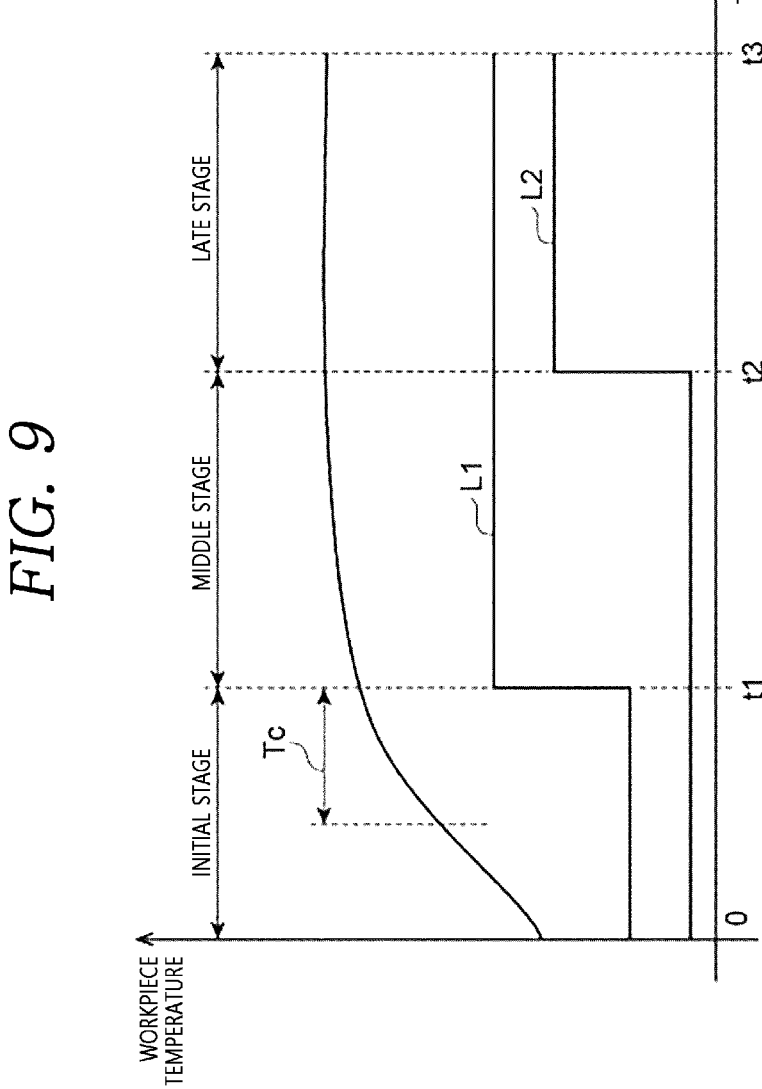
FIG. 9 is a diagram illustrating an example of a relationship between a size of a gas flow and a temperature of a workpiece in the heat treatment sequence.

Additionally, a flow of a gas within the chamber 30 during the heat treatment sequence is schematically illustrated in FIG. 8A to FIG. 8C. Further, a relationship between a gas discharge amount from the gas discharger 50, a gas exhaust amount from the peripheral exhaust device 60, and the temperature of the workpiece W in the chamber 30 during the heat treatment sequence is schematically illustrated in FIG. 9.

First, the controller 104 controls the heat treatment device U2 to carry the workpiece W as the processing target on which the film of the processing liquid is formed into the chamber 30 (process S11).

For example, the controller 104 controls the chamber driver 38 to perform a switchover from a closed state in which the processing space S is formed in the chamber 30 into an open state in which the upper chamber 31 is distanced apart from the lower chamber 32. Next, the controller 104 controls the heat treatment device U2 to insert the cooling plate on which the workpiece W to be processed is placed into a space between the hot plate 22 and the upper chamber 31 (to place it at the carry-in/carry-out position). Then, the controller 104 raises a supporting pin such that the supporting pin receives the workpiece W on the cooling plate disposed above the hot plate 22. Accordingly, the workpiece W to be processed is carried into the chamber 30.

Thereafter, the controller 104 lowers the supporting pin supporting the workpiece W thereon, so that the workpiece W is lowered to be placed on the placement surface 22*a* of the hot plate 22. Additionally, by controlling the chamber driver 38 to lower the upper chamber 31, the chamber 30 is closed, and the processing space S is formed above the workpiece W.

Next, the controller 104 controls the heat treatment device U2 such that the gas exhaust amount (peripheral exhaust) by the peripheral exhaust device 60 and the gas discharge amount (gas supply) from the gas discharger 50 are both in a "weak" state (process S12). For example, the controller 104 turns an opening/closing valve provided in the supply path 56 from a closed state to an open state to supply the gas from the gas source into the gas distribution space of the head member 52. As a result, the gas is discharged from the plurality of discharge holes 54 formed in the head member 52. Further, the controller 104 may set the gas discharge amount to the "weak" state by regulating the opening/closing valve to a predetermined opening degree. Likewise, the controller 104 may control the exhaust device 60 to set the gas exhaust amount to the "weak" state by regulating the valve 67 to a predetermined opening degree.

In addition, between the adjustment of the gas exhaust by the peripheral exhaust device 60 and the adjustment of the gas supply from the gas discharger 50, the adjustment of the gas exhaust amount from the peripheral exhaust device 60 may be performed before the workpiece W is carried in.

The heat treatment is started in the state that the gas is discharged from the gas discharger 50 and the gas exhaust is performed from the peripheral exhaust device 60. At this time, the gas discharged from the gas discharger 50 and the gas introduced into the processing space S through the gap formed between the peripheral wall 322 of the lower chamber 32 and the hot plate 22 are exhausted from the peripheral exhaust device 60.

FIG. 8A is a diagram schematically showing flows of the gas supply and the gas exhaust to/from the processing space S. As shown in FIG. 8A, a flow F1 of the gas supplied from the gas discharger 50 to the entire top surface of the workpiece W is set to be weak, and a flow F2 of the gas exhausted from the outer periphery of the workpiece W is set to be weak. As a result, a gentle gas flow toward the outer periphery of the workpiece W is formed on the surface of the workpiece W.

Next, the controller 104 stands by until a first preset period elapses after heating of the workpiece W is started (process S13). The first preset period is a period stored in the storage 102, and corresponds to a period from time 0 to time t1 shown in FIG. 9. The first preset period is set to allow the film on the workpiece W to be solidified to a predetermined level. As an example, the first preset period may be set based on the time t1, which is a timepoint after a solvent of the film on the workpiece W reaches a temperature at which it volatilizes. In addition, based on, for example, the solidification state of the film on the workpiece W, a timing at which the surface of the workpiece W is turned into a predetermined state may be set as the time t1. As an example, the time t1 may be set to be in the range of ⅕ to ⅓ of a heat treatment time (during the period from the time 0 to time t3 shown in FIG. 9) for the workpiece W. The time t1 may be determined by repeating an experiment using a test workpiece which is the same as the workpiece W.

In FIG. 9, the gas exhaust amount (peripheral exhaust) by the peripheral exhaust device 60 is indicated by a line L1, and the gas discharge amount (gas supply) from the gas discharger 50 is indicated by a line L2. Further, FIG. 9 schematically illustrates a temperature variation of the workpiece W being processed. As shown in FIG. 9, a period (initial stage) from the time 0 to the time t1 is a period in which the temperature of the workpiece W placed on the hot plate increases. In this stage, the film is gradually solidified as the temperature of the workpiece W rises. At this time, a sublimate resulting from a crosslinking reaction of components in the film may be gradually generated and distributed into the processing space S. In particular, a time slot Tc shown in FIG. 9 is a time period before the surface of the film is sufficiently solidified and in which the amount of the sublimate generated due to the crosslinking reaction or the like is large.

While the controller 104 stands by until the first preset period elapses, both the gas exhaust amount (peripheral exhaust) from the peripheral exhaust device 60 and the gas discharge amount (gas supply) from the gas discharger 50 are kept in the 'weak' state. Meanwhile, in the initial stage from the start of the heating of the workpiece W, solidification (formation) of the film of the workpiece W progresses. As described above, by setting both the gas supply and the gas exhaust to be in the weak state, the film formation can be suppressed from being affected by a gas flow that is generated along when the gas supply and the gas exhaust are performed.

After the first preset period elapses, the controller 104 controls the heat treatment device U2 such that the gas exhaust amount (peripheral exhaust) by the peripheral exhaust device 60 is turned into a "strong" state (process S14). For example, the controller 104 may increase the opening degree of the valve 67 of the peripheral exhaust device 60 to set the gas exhaust amount to be in the "strong" state. In addition, the gas discharge amount (gas supply) from the gas discharger 50 is kept in the "weak" state.

At this time, the flow F1 of the gas supplied from the gas discharger 50 to the entire top surface of the workpiece W becomes weak, whereas the flow F2 of the gas exhausted from the outer periphery of the workpiece W becomes strong, as shown in FIG. 8B. As a result, a gas flow heading toward the outer peripheral side is formed on the surface of the workpiece W, and this flow is enhanced. For this reason, the gas above the workpiece W is directed toward the outer peripheral side to be exhausted to the outside of the processing space S.

In this state, the controller 104 stands by until a second preset period elapses (process S15). The second preset period is a period stored in the storage 102, and corresponds to a period from the time t1 to time t2 shown in FIG. 9. The second preset period is set to allow the film on the workpiece W to be further solidified to be solidified stably as a whole. As an example, the second preset period may be set based on the time t2 when the temperature of the workpiece W reaches a value within ±1° C. of a target temperature of the heat treatment. In addition, based on, for example, the solidification state of the film on the workpiece W, a timing when the state of the surface of the workpiece W is solidified to some extent so that the thickness of the film becomes stable may be set as the time t2. As an example, the time t2 is set to be in the range of ⅓ to ¾ of the heat treatment time (the period from the time 0 to the time t3 in FIG. 9) for the workpiece W. The time t2 may be determined by repeating an experiment using a test workpiece which is the same as the workpiece W.

As shown in FIG. 9, a period (middle stage) from the time t1 to the time t2 is a time period in which the temperature of the workpiece W placed on the hot plate gradually stabilizes. In the meantime, the solidification (formation) of the film on the workpiece W progresses, so that the film becomes more stable. In this stage, although the amount of the sublimate generated from the film of the workpiece W gradually decreases, the sublimate may be still generated until the film is completely solidified. For this reason, the sublimate may stay in the processing space S to some extent.

Meanwhile, while the controller 104 stands by until the second preset period elapses, the state in which the gas exhaust amount (peripheral exhaust) from the peripheral exhaust device 60 is "strong" and the gas discharge amount (gas supply) from the gas discharger 50 is "week" is maintained. As a result, the sublimate from the film which stays above the workpiece W is removed to the outside of the chamber 30. In particular, as the gas exhaust amount on the outer peripheral side is greatly adjusted, the removal of the sublimate generated in and after the time period Tc shown in FIG. 9 is accelerated.

After the lapse of the second preset period, the controller 104 controls the heat treatment device U2 such that the gas discharge amount (gas supply) from the gas discharger 50 is turned into a "strong" state (process S16). For example, the controller 104 may increase the opening degree of the opening/closing valve provided in the supply path 56 to set the gas supply amount (the gas discharge amount from the gas discharger) to be in the "strong" state. As a result, both the gas exhaust amount (peripheral exhaust) by the peripheral exhaust device 60 and the gas discharge amount (gas supply) from the gas discharger 50 are set to be in the "strong" state.

At this time, the flow F1 of the gas supplied from the gas discharger 50 to the entire top surface of the workpiece W and the flow F2 of the gas exhausted from the outer periphery of the workpiece W become strong, as shown in FIG. 8C. As a result, the gas flow heading toward the outer peripheral side is further enhanced on the surface of the workpiece W.

In this state, the controller 104 stands by until a third preset period passes by (process S17). The third preset period is a period stored in the storage 102, and corresponds to a period from the time t2 to the time t3 shown in FIG. 9. The third preset period is set to allow the solidification of the film on the workpiece W to be approximately completed. As an example, the third preset period may be set based on the time t3 upon the lapse of a predetermined time after the temperature of the workpiece W reaches a value within ±1° C. of the target temperature of the heat treatment. In addition, a timing at which the film on the workpiece W can be completely solidified may be set as the time t3, for example. The time t3 may be determined by repeating an experiment using a test workpiece which is the same as the workpiece W.

As depicted in FIG. 9, in a period (late stage) from the time t2 to the time t3, the temperature of the workpiece W placed on the hot plate is sufficiently stable. During this period, the film of the workpiece W is solidified entirely. In this stage, the amount of the sublimate generated from the film of the workpiece W decreases, so no sublimate is replenished into the processing space S.

While the controller 104 stands by until the third preset period elapses, the gas exhaust amount (peripheral exhaust) by the peripheral exhaust device 60 and the gas discharge amount (gas supply) from the gas discharger 50 are kept in the "strong" state. For this reason, as for the gas supplied from the gas discharger 50 from above the workpiece W into the processing space S, the flow of the gas exhausted from the outer peripheral side after being moved above the workpiece W is further enhanced, so that the sublimate staying above the workpiece W is easily removed to the outside of the chamber 30 by being carried on this gas flow.

Upon the lapse of the third preset period, the controller 104 performs a carrying-out operation for the workpiece W (process S18). Specifically, the controller 104 controls the chamber driver 38 to perform a switchover from the closed state in which the chamber 30 is adjacent to the hot plate 22 into the open state in which the upper chamber 31 is distanced apart from the hot plate 22, thus allowing the processing space S to be opened to the outside of the chamber 30. In this way, after bringing the workpiece W adjacent to the ceiling plate 311 of the upper chamber 31 (more specifically, after keeping the state in which the upper chamber 31 is adjacent to the ceiling plate 311), the controller 104 controls the chamber driver 38 to perform the switchover from the closed state to the open state. In this state, the controller 104 operates the supporting pin to raise the workpiece W, and also controls the cooling plate and the like to carry the workpiece W to the outside of the chamber 30. As a result, the workpiece W is handed over from between the chamber 30 and the hot plate 22 to the cooling plate inserted into the chamber 30, and is carried out of the chamber 30. Through these operations, the series of processes of the heat treatment on the single sheet of workpiece W are completed.

In addition, until a next workpiece W is carried in after the current workpiece W is carried out, the controller 104 controls the gas exhaust amount (peripheral exhaust) by the peripheral exhaust device 60 and the gas discharge amount (gas supply) from the gas discharger 50 to be in "weak" states. This is to suppress the disturbance of the gas flow within the processing space S when the next workpiece W is carried in.

In the period of replacing the workpiece W to be processed, by turning the gas exhaust amount (peripheral exhaust) by the peripheral exhaust device 60 and the gas discharge amount (gas supply) from the gas discharger 50 to be in the "weak" state, a film yet to be solidified is suppressed from being affected by the gas flow when the next workpiece W is carried in.

[Operations]

The coating and developing apparatus 2 according to the above-described exemplary embodiment includes the heat treatment device U2 configured to perform the heat treatment on the workpiece W on which the film is formed, and the control device 100 configured to control the heat treatment device U2. The heat treatment device U2 includes the heating device 20 configured to support and heat the workpiece W thereon and including the hot plate 22; the chamber 30 covering the workpiece W supported on the heating device 20; the gas discharger 50 having the head member 52 provided with the plurality of discharge holes 54 distributed along the surface thereof facing the workpiece W supported on the heating device 20 and configured to discharge the gas toward the surface of the workpiece W from the plurality of discharge holes 54; and the peripheral exhaust device 60 configured to evacuate the processing space S within the chamber 30 from the outer peripheral region outside the periphery of the workpiece W supported on the heating device 20. At this time, the control device 100 controls the peripheral exhaust device 60 to increase the gas exhaust amount from the peripheral exhaust device 60 in the state that the workpiece W is heated.

Additionally, the substrate processing sequence according to the above-described exemplary embodiment includes performing the heat treatment on the workpiece W on which the film is formed. The performing of the heat treatment on the workpiece W includes heating the workpiece W covered with the chamber 30 by supporting the workpiece W on the hot plate 22 of the heating device 20, evacuating the processing space S in the chamber 30 from the outer peripheral region outside the periphery of the workpiece W supported on the hot plate 22, and discharging the gas toward the surface of the substrate from the plurality of discharge holes 54 distributed along the surface facing the workpiece W supported on the hot plate 22, and further includes increasing the gas exhaust amount in the evacuating of the processing space S while performing the evacuating of the processing space S and the discharging of the gas simultaneously in the state that the heating of the workpiece W is being performed.

In the coating and developing apparatus 2 and the substrate processing sequence described above, since the evacuation is performed from the peripheral exhaust device 60 while the heat treatment is being performed on the workpiece W as the processing target, an effect on the film, particularly, an effect on the film thickness that might be caused by the gas flow generated when the evacuation is performed from the central region can be reduced. In addition, by increasing the gas exhaust amount from the peripheral exhaust device 60 in the state that the workpiece W is heated, it becomes possible to efficiently recover the sublimate in the late stage of the heat treatment. Thus, a damage to the workpiece W due to the sublimate can be suppressed.

Additionally, the control device 100 may control the gas discharger 50 to increase the discharge amount from the gas discharger 50 in the state that the workpiece W is heated. With this configuration, the sublimate can be efficiently moved by using the gas flow near the surface of the workpiece W, which makes it possible to suppress a defect of the workpiece W that might be caused in the heat treatment.

Further, the control of increasing the discharge amount from the gas discharger 50 by the control device 100 may be performed after the control of increasing the exhaust amount from the peripheral exhaust device 60. With this configuration, it becomes possible to efficiently recover the sublimate while avoiding the film being affected by the increase of the discharge amount of the gas toward the surface of the workpiece W. Thus, the damage to the workpiece W due to the sublimate can be further suppressed.

Moreover, within the chamber 30, the buffer space B connected to the processing space S may be formed below the hot plate 22, and the intake port 323 as the gas supply configured to supply the gas from the outside of the chamber 30 into the buffer space B may be further provided. At this time, the buffer space B may have a larger volume than the processing space S. With this configuration, since the gas supplied from the intake port 323 is introduced into the processing space S after being heated in the buffer space B, the change in the temperature of the workpiece W in the processing space S is suppressed. Further, the members around the processing space S, such as the upper chamber 31, are suppressed from being cooled by the gas supplied from the intake port 323. Accordingly, the sublimate in the processing space S is suppressed from being solidified as a result of coming into contact with the cooled member. In addition, since the volume of the processing space S is small, the heat capacity of the gas inside the processing space S becomes also small. Accordingly, the temperature of the processing space S becomes more likely to be stabilized, and the heat treatment of the workpiece W itself can be performed stably.

The hot plate 22 may have the attraction hole 22b for attracting the workpiece W to the hot plate 22, and may further have the resin pad 43 having the flow path communicating with the attraction hole 22b. At this time, the resin pad 43 may be allowed to communicate with the attraction hole 22b and connected to the hot plate 22 via the metal member 42. In this case, as compared to the case where the resin pad 43 is directly connected to the hot plate 22, the deterioration of the resin pad 43 due to the heat from the hot plate 22 can be suppressed.

Moreover, the metal member 42 may have the large-diameter portion 42a. Further, the flow path space 42b having the large cross-sectional area may be provided inside the large-diameter portion 42a. With this configuration, the risk of clogging due to the sublimate generated from the heat treatment is reduced. Additionally, the heat of the gas drawn from the processing space S when the workpiece W is attracted is reduced due to the flow path space 42b having the large cross-sectional area inside the large-diameter portion 42a. Therefore, the risk of deterioration of the resin pad 43 on the downstream side and the devices constituting the exhaust path leading to the exhaust line 27 due to the high temperature can be suppressed.

Additionally, the annular member 332 connected below to the hot plate 22 with the supporting column 331 therebetween may be further provided. At this time, the resin pad 43 may be located below the annular member 332. With this configuration, the annular member 332 can effectively block the heat from the hot plate 22, making it difficult for the resin pad 43 to be exposed to the high temperature. Therefore, the deterioration of the resin pad 43 due to heat can be suppressed.

In addition, in the above-described exemplary embodiment, since the gas discharged from the plurality of discharge holes 54 provided in the head member 52 of the gas discharger 50 are all distributed in the gas distribution space, the discharged gas is of the same kind and of the same temperature. Meanwhile, the control device 100 may control the gas discharger 50 such that the temperature of the gas discharged from the discharge holes 54 facing the outer periphery of the workpiece W among the plurality of discharge holes 54 provided in the head member 52 of the gas discharger 50 becomes higher than the temperature of the gas discharged from the discharge holes 54 facing the center of the workpiece W. With this configuration, the solidification of the film can be promoted, especially on the outer peripheral side of the workpiece W. In the above-described heat treatment device U2, since the gas flow heading toward the outer side of the workpiece W from the center side thereof is generated as the evacuation by the peripheral exhaust device 60 is performed, a solvent concentration in the space above the outer peripheral side of the workpiece W tends to become higher than that in the space on the central side. That is, since the evacuation is performed by the peripheral exhaust device 60, volatilization of the solvent on the central side of the workpiece W is likely to be accelerated, whereas the volatilization of the solvent on the outer peripheral side of the workpiece W is likely to slow down. This difference in the volatilization rate of the solvent may affect the uniformity of the film on the workpiece W. In view of this, by controlling the gas discharger 50 to increase the temperature of the gas discharged from the discharge holes 54 facing the outer periphery of the workpiece W as described above, the difference in the volatilization rate of the solvent between the inner side and the outer side of the workpiece W is reduced, so that the uniformity of the film can be improved. This control of setting the temperature of the gas to be different between the central side and the outer peripheral side of the workpiece W as described above is effective in the whole period of the heat treatment ranging from the early stage to the late stage (see FIG. 9), for example.

The control device 100 may control the gas discharger 50 such that the flow velocity of the gas discharged from the discharge holes 54 facing the outer periphery of the workpiece W among the plurality of discharge holes 54 provided in the head member 52 of the gas discharger 50 becomes larger than the flow velocity of the gas discharged from the discharge holes 54 facing the center of the workpiece W. For example, in FIG. 4, among the discharge holes 54, the discharge holes 54 included in a preset central region facing the center of the workpiece W are collectively defined as a central discharge area (not shown), and the discharge holes 54 in a circumferential area outside the central discharge area are collectively defined as a peripheral discharge area (not shown). This configuration is implemented by dividing the interior of the head member 52 into the central discharge area and the peripheral discharge area with a partition wall and connecting separate gas supply paths (not shown) to these discharge areas. With this configuration, the damage to the workpiece W resulting from the sublimate can be suppressed, especially on the outer peripheral side of the workpiece W. In the heat treatment device U2 described above, since the evacuation is performed by the peripheral exhaust device 60, the sublimate generated on the central side of the workpiece W is moved to the outer peripheral side. As a result, the damage due to the sublimate may easily occur on the outer peripheral side of the workpiece W. As a resolution, by controlling the gas discharger 50 to increase the flow velocity of the gas discharged from the discharge holes 54 facing the outer periphery of the workpiece W as described above, the move of the sublimate on the outer peripheral side of the workpiece W is accelerated, so that the recovery efficiency of the sublimate can be improved. The control of setting the flow velocity of the gas to be different between the central side and the outer peripheral side of the workpiece W as described above is effective in the late stage of the heat treatment (see FIG. 9), for example.

MODIFICATION EXAMPLES

The configuration of the heat treatment device U2 described above is nothing more than an example and may be modified appropriately. For example, the shapes of the upper chamber 31 and the lower chamber 32 of the chamber 30 are not limited to the example of the above-described exemplary embodiment, and may be changed appropriately.

In addition, in the above-described heat treatment sequence, both the exhaust amount (peripheral exhaust) by the peripheral exhaust device 60 and the gas discharge amount (gas supply) from the gas discharger 50 are varied during the heat treatment. However, only the exhaust amount (peripheral exhaust) by the peripheral exhaust device 60 may be varied. In addition, although the variation is made in the two stages of "weak" and "strong" in the above-described heat treatment sequence, the variation may be made in multiple stages with three or more stages.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

[Appended]

Here, the various exemplary embodiments included in the present disclosure are described as follows.

[1] A substrate processing apparatus, comprising:

a hot plate configured to support a substrate having a film formed thereon and perform a heat treatment of heating the substrate;

a chamber configured to cover the substrate supported by the hot plate;

a gas discharger, having a head member provided with multiple discharge holes distributed along a surface facing the substrate supported by the hot plate, configured to discharge a gas toward a surface of the substrate from the multiple discharge holes;

a peripheral exhaust device configured to evacuate a processing space within the chamber from an outer peripheral region outside a periphery of the substrate supported by the hot plate; and a controller, wherein the controller controls the peripheral exhaust device to increase an exhaust amount from the peripheral exhaust device in a state that the substrate is heated.

In the substrate processing apparatus described above, since the evacuation is performed from the peripheral exhaust device while the heat treatment is being performed on the substrate as the processing target, an effect on the film, particularly, an effect on the film thickness that might be caused by the gas flow generated when the evacuation is performed from the central region can be reduced. In addition, by increasing the gas exhaust amount from the peripheral exhaust device in the state that the substrate is heated, it becomes possible to efficiently recover the sublimate in the late stage of the heat treatment. Thus, a damage to the substrate due to the sublimate can be suppressed.

[2] The substrate processing apparatus described in [1], wherein the controller controls the gas discharger to increase a discharge amount from the gas discharger in the state that the substrate is heated.

With this configuration, the sublimate can be efficiently moved by using the gas flow near the surface of the substrate, which makes it possible to suppress a defect of the substrate that might be caused in the heat treatment.

[3] The substrate processing apparatus described in [2], wherein a control of increasing the discharge amount from the gas discharger by the controller is performed after a control of increasing the exhaust amount from the peripheral exhaust device.

With this configuration, it becomes possible to efficiently recover the sublimate while avoiding the film being affected by the increase of the discharge amount of the gas toward the surface of the substrate. Thus, the damage to the substrate due to the sublimate can be further suppressed.

[4] The substrate processing apparatus described in any one of [1] to [3], wherein a buffer space connected to the processing space is formed under the hot plate in the chamber, the substrate processing apparatus further includes a gas supply configured to supply a gas into the buffer space from an outside of the chamber, and the buffer space has a larger volume than the processing space.

With this configuration, since the gas supplied from the gas supply is introduced into the processing space after being heated in the buffer space, the change in the temperature of the substrate in the processing space is suppressed. Further, the members around the processing space are suppressed from being cooled by the gas supplied from the gas supply. Accordingly, the sublimate is suppressed from being solidified as a result of coming into contact with the cooled member.

[5] The substrate processing apparatus described in any one of [1] to [4], wherein the hot plate is provided with an attraction hole configured to attract the substrate to the hot plate, the substrate processing apparatus further includes a resin pad having a flow path communicating with the attraction hole, and the resin pad is allowed to communicate with the attraction hole and connected to the hot plate via a metal member.

With this configuration, as compared to the case where the resin pad is directly connected to the hot plate, the deterioration of the resin pad due to the heat from the hot plate can be suppressed.

[6] The substrate processing apparatus described in [5], wherein the metal member has a large-diameter portion.

With this configuration, since the flow path space having the large cross-sectional area may be provided inside the large-diameter portion, the risk of clogging due to the sublimate generated from the heat treatment is reduced. Additionally, the heat of the gas drawn from the processing space when the substrate is attracted is reduced due to the flow path space having the large cross-sectional area. Therefore, the risk of deterioration due to the flowing of the gas having high temperature to a downstream side can be suppressed.

[7] The substrate processing apparatus described in [5], further comprising:

an annular member connected to the hot plate via a supporting column to be positioned under the hot plate, wherein the resin pad is located under the annular member.

With this configuration, the annular member can effectively block the heat from the hot plate, making it difficult for the resin pad to be exposed to the high temperature. Therefore, the deterioration of the resin pad due to heat can be suppressed.

[8] The substrate processing apparatus described in any one of [1] to [7], wherein, among the multiple discharge holes provided in the head member of the gas discharger, the controller controls the gas discharger such that a temperature of the gas discharged from a discharge hole facing an outer periphery of the substrate is higher than a temperature of the gas discharged from a discharge hole facing a center of the substrate.

[9] The substrate processing apparatus described in any one of [1] to [7], wherein, among the multiple discharge holes provided in the head member of the gas discharger, the controller controls the gas discharger such that a flow velocity of the gas discharged from a discharge hole facing an outer periphery of the substrate is higher than a flow velocity of the gas discharged from a discharge hole facing a center of the substrate.

With this configuration, the damage to the substrate resulting from the sublimate can be suppressed, especially on the outer peripheral side of the substrate.

Further, the exemplary embodiment according to the substrate processing apparatus of [1] to [9] can also be described as the exemplary embodiment according to the substrate processing method of [10] to [18]. The substrate processing method described in [10] to can achieve the same effects as the substrate processing apparatus described in [1] to [9], respectively.

[10] A substrate processing method including performing a heat treatment on a substrate having a film formed thereon, wherein the performing of the heat treatment on the substrate includes:

heating the substrate covered with a chamber by placing the substrate on a hot plate of a heating device;

evacuating a processing space within the chamber from an outer peripheral region outside a periphery of the substrate supported by the hot plate; and discharging a gas toward a surface of the substrate from multiple discharge holes distributed along a surface facing the substrate supported by the hot plate, and wherein the substrate processing method further includes increasing an exhaust amount in the evacuating of the processing space while performing the evacuating of the processing space and the discharging of the gas simultaneously in a state that the heating of the substrate is being performed.

[11] The substrate processing method described in [10], further comprising:

increasing a discharge amount in the discharging of the gas while performing the evacuating of the processing space and the discharging of the gas simultaneously in the state that the heating of the substrate is being performed.

[12] The substrate processing method described in [11], wherein the increasing of the discharge amount in the discharging of the gas is performed after the increasing of the exhaust amount in the evacuating of the processing space.

[13] The substrate processing method described in any one of [10] to [12], wherein a buffer space connected to the processing space is formed under the hot plate in the chamber, the substrate processing method further includes supplying a gas into the buffer space from an outside of the chamber, and the buffer space has a larger volume than the processing space.

[14] The substrate processing method described in any one of [10] to [13], wherein the hot plate is provided with an attraction hole configured to attract the substrate to the hot plate, a resin pad having a flow path communicating with the attraction hole is further provided, and the resin pad is allowed to communicate with the attraction hole and connected to the hot plate via a metal member.

[15] The substrate processing method described in [14], wherein the metal member has a larger-diameter portion.

[16] The substrate processing method described in [14], wherein an annular member connected to the hot plate via a supporting column is provided under the hot plate, and the resin pad is located under the annular member.

[17] The substrate processing method described in any one of [10] to [16], wherein in the discharging of the gas, a temperature of the gas discharged from a discharge hole facing an outer periphery of the substrate among the multiple discharge holes is set to be higher than a temperature of the gas discharged from a discharge hole facing a center of the substrate.

[18] The substrate processing method described in any one of [10] to [16], wherein in the discharging of the gas, a flow velocity of the gas discharged from a discharge hole facing an outer periphery of the substrate among the multiple discharge holes is set to be larger than a flow velocity of the gas discharged from a discharge hole facing a center of the substrate.

According to the exemplary embodiment, it is possible to provide the technique capable of suppressing the defect in the substrate that might be caused in the heat treatment.

We claim:

1. A substrate processing apparatus, comprising:

a hot plate configured to support a substrate having a film formed thereon and perform a heat treatment of heating the substrate;

a chamber configured to cover the substrate supported by the hot plate;

a gas discharger, having a head member provided with multiple discharge holes distributed along a surface facing the substrate supported by the hot plate, configured to discharge a gas toward a surface of the substrate from the multiple discharge holes;

a peripheral exhaust device configured to evacuate gas in a processing space within the chamber from an outer peripheral region outside a periphery of the substrate supported by the hot plate; and a controller, wherein the controller controls the peripheral exhaust device, after heating of the substrate by the hot plate has started and after a preset period has elapsed, to increase an exhaust amount from the peripheral exhaust device, by adjusting an opening degree of a valve of the peripheral exhaust device.

2. The substrate processing apparatus of claim 1, wherein the controller controls the gas discharger to increase a discharge amount from the gas discharger in the state that the substrate is heated.

3. The substrate processing apparatus of claim 2, wherein a control of increasing the discharge amount from the gas discharger by the controller is performed after a control of increasing the exhaust amount from the peripheral exhaust device.

4. The substrate processing apparatus of claim 1, wherein a buffer space connected to the processing space is formed under the hot plate in the chamber, the substrate processing apparatus further comprises a gas supply configured to supply a gas into the buffer space from an outside of the chamber, and the buffer space has a larger volume than the processing space.

5. The substrate processing apparatus of claim 1, wherein the hot plate is provided with an attraction hole configured to attract the substrate to the hot plate, the substrate processing apparatus further comprises a resin pad having a flow path communicating with the attraction hole, and the resin pad is allowed to communicate with the attraction hole and connected to the hot plate via a metal member.

6. The substrate processing apparatus of claim 5, wherein the metal member has a large-diameter portion.

7. The substrate processing apparatus of claim 5, further comprising:

an annular member connected to the hot plate via a supporting column to be positioned under the hot plate, wherein the resin pad is located under the annular member.

8. The substrate processing apparatus of claim 1, wherein, among the multiple discharge holes provided in the head member of the gas discharger, the controller controls the gas discharger such that a temperature of the gas discharged from a discharge hole facing an outer periphery of the substrate is higher than a temperature of the gas discharged from a discharge hole facing a center of the substrate.

9. The substrate processing apparatus of claim 1, wherein, among the multiple discharge holes provided in the head member of the gas discharger, the controller controls the gas discharger such that a flow velocity of the gas discharged from a discharge hole facing an outer periphery of the substrate is higher than a flow velocity of the gas discharged from a discharge hole facing a center of the substrate.

10. A substrate processing method including performing a heat treatment on a substrate having a film formed thereon, wherein the performing of the heat treatment on the substrate comprises:

heating the substrate covered with a chamber by placing the substrate on a hot plate of a heating device;

evacuating, by a peripheral exhaust device, gas in a processing space within the chamber from an outer peripheral region outside a periphery of the substrate supported by the hot plate; and discharging a gas toward a surface of the substrate from multiple discharge holes distributed along a surface facing the substrate supported by the hot plate, and wherein the substrate processing method further comprises, after heating of the substrate by the hot plate has started and after a preset period has elapsed, increasing an exhaust amount in the evacuating of gas in the processing space by adjusting an opening degree of a valve of the peripheral exhaust device while performing the evacuating of gas in the processing space and the discharging of the gas simultaneously.

11. The substrate processing method of claim 10, further comprising:

increasing a discharge amount in the discharging of the gas while performing the evacuating of the processing space and the discharging of the gas simultaneously in the state that the heating of the substrate is being performed.

12. The substrate processing method of claim 11, wherein the increasing of the discharge amount in the discharging of the gas is performed after the increasing of the exhaust amount in the evacuating of the processing space.

13. The substrate processing method of claim 10, wherein a buffer space connected to the processing space is formed under the hot plate in the chamber, the substrate processing method further comprises supplying a gas into the buffer space from an outside of the chamber, and the buffer space has a larger volume than the processing space.

14. The substrate processing method of claim 10, wherein the hot plate is provided with an attraction hole configured to attract the substrate to the hot plate, a resin pad having a flow path communicating with the attraction hole is further provided, and the resin pad is allowed to communicate with the attraction hole and connected to the hot plate via a metal member.

15. The substrate processing method of claim 14, wherein the metal member has a larger-diameter portion.

16. The substrate processing method of claim 14, wherein an annular member connected to the hot plate via a supporting column is provided under the hot plate, and the resin pad is located under the annular member.

17. The substrate processing method of claim 10, wherein in the discharging of the gas, a temperature of the gas discharged from a discharge hole facing an outer periphery of the substrate among the multiple discharge holes is set to be higher than a temperature of the gas discharged from a discharge hole facing a center of the substrate.

18. The substrate processing method of claim 10, wherein in the discharging of the gas, a flow velocity of the gas discharged from a discharge hole facing an outer periphery of the substrate among the multiple discharge holes is set to be larger than a flow velocity of the gas discharged from a discharge hole facing a center of the substrate.

* * * * *